United States Patent [19]
Kamiya

[11] Patent Number: 4,989,031
[45] Date of Patent: Jan. 29, 1991

[54] PROJECTION EXPOSURE APPARATUS
[75] Inventor: Saburo Kamiya, Yokohama, Japan
[73] Assignee: Nikon Corporation, Tokyo, Japan
[21] Appl. No.: 471,375
[22] Filed: Jan. 29, 1990
[51] Int. Cl.[5] .................... G03B 27/52; G03B 27/42
[52] U.S. Cl. .................................. 355/30; 355/53; 355/55
[58] Field of Search ........................ 355/30, 53, 55
[56] References Cited

U.S. PATENT DOCUMENTS

| | | | |
|---|---|---|---|
| 4,202,623 | 5/1980 | Watkin | 355/30 |
| 4,432,635 | 2/1984 | Mayer | 355/30 |
| 4,496,239 | 1/1985 | Isohata et al. | 355/53 X |
| 4,540,251 | 9/1985 | Yau et al. | 355/30 X |
| 4,564,284 | 1/1986 | Tsutsui | 355/30 |
| 4,583,840 | 4/1986 | Yabu et al. | 355/30 |
| 4,668,077 | 5/1987 | Tanaka | 355/53 X |
| 4,699,505 | 10/1987 | Komoriya et al. | 355/30 |
| 4,704,348 | 11/1987 | Koizumi et al. | 355/53 X |
| 4,730,900 | 3/1988 | Uehara et al. | 355/55 X |
| 4,780,747 | 10/1988 | Suzuki et al. | 355/53 X |
| 4,786,947 | 11/1988 | Kosugi et al. | 355/53 X |
| 4,825,247 | 4/1989 | Kemi et al. | 355/53 X |

Primary Examiner—Richard A. Wintercorn
Attorney, Agent, or Firm—Michael N. Meller

[57] ABSTRACT

A projection exposure apparatus used for the purpose of forming extremely fine patterns, e.g., semiconductor integrated circuits on a wafer. The apparatus includes an illuminating optical system for irradiating a reticle with light emitted from a light source, a projection optical system for projecting an image of the reticle onto a wafer which is to be exposed, a first chamber for enclosing the projection exposure apparatus on the whole, a second chamber arranged inside the first chamber to enclose a space containing an optical path of an exposure light between the projection optical system and the wafer, and means for separately adjusting internal air temperatures of the first and second chambers.

4 Claims, 3 Drawing Sheets

PROJECTION EXPOSURE APPARATUS

BACKGROUND OF THE INVENTION

1. Field of the Invention

The present invention relates to a projection exposure apparatus used in the production of extremely fine patterns such as semiconductor integrated circuits.

2. Description of the Prior Art

With the recent trend toward increasing the level of integration of semiconductor integrated circuits, projection exposure apparatus heretofore used for projecting and transcribing the pattern of a reticle onto a wafer have predominatly consisted of so-called steppers so designed that a high-resolution reduction projection lens is mounted and a wafer is moved in a step and repeat manner, thereby projecting and transcribing patterns sequentially on the plurality of exposure areas of the wafer.

The stepper is required to meet a degree of accuracy of alignment (registration of the projection image of a reticle with the patterns formed on a wafer by the preceding wafer process) corresponding to the resolution of the projection lens. Generally, an alignment accuracy of 1/5 to 1/10 of the minimum resolution linewidth of the projection lens is required. Therefore, an alignment accuracy of 0.08 to 0.16 $\mu$m is required for a lens which for example resolves patterns of 0.8 $\mu$m width for VLSI manufacturing purposes.

In order to realize such a highly accurate alignment, it is important to adjust the various parts of the apparatus in temperature and the usual practice in the past has been such that as shown in FIG. 4, the whole apparatus is arranged inside a temperature adjusting chamber 120 and the internal air temperature of the chamber 120 is controlled. In FIG. 4, a reticle 102 is illuminated by an illuminating optical system 101 so that the image of the pattern formed on the reticle 102 is projected and transcribed through a projection lens 103 on an exposure area of a wafer 104 which is positioned just below the projection lens 103.

The wafer 104 is movable by a Z-stage 105 in a vertical direction (the direction of the optical axis of the projecting lens) and it is also movable in X and Y directions (the directions perpendicular to the optical axis of the projection lens) by an X-stage 106 and a Y-stage 107, respectively. Then, the X-direction and Y-direction positions of the wafer 104 are monitored by means of a laser interferometer-type linear scale 110 and the wafer 104 is positioned in a desired position by the X-stage 106 and the Y-stage 107. Also, the height of the surface of the wafer 104 is detected by a height sensor which is not shown and its height is adjusted by the Z-stage 105.

This apparatus on the whole is mounted on a surface table 108 subjected to vibration damping by a plurality of vibration damping bases 109 and in this condition the apparatus is installed within the temperature adjusting chamber 120. The air adjusted to a preset temperature by a heat exchanger 121 is blown into the temperature adjusting chamber 120 through a blowing duct 122 and the blown air is discharged through a return duct 123. Although not shown in the Figure, the air delivered from the blowing duct 122 flows into the surroundings of the reticle 102 as well as the surroundings of the projection lens 103 and the wafer stages (105, 106 and 107).

In the case of the conventional technique described above, however, the whole apparatus is enclosed by the partition wall of the single chamber thereby air conditioning the apparatus as a whole and therefore the apparatus is affected considerably by the heat generated from such heat sources as various electronic component parts, motor and laser, thereby making it difficult to maintain the temporal and spatial uniformity of the refractive index of the air in the space containing the projection optical system between the reticle and the wafer. In other words, the refractive index of the air varies in dependence on the temperature and thus the image forming position is varied or the image is distorted, thereby giving rise to a major cause of deteriorating the alignment accuracy.

SUMMARY OF THE INVENTION

It is the primary object of the present invention to provide a projection exposure apparatus which is capable of minimizing the variation in the refractive index of the air in the spaces forming the optical paths for the exposure light and ensuring a satisfactory alignment accuracy.

In accordance with the present invention, there is provided a projection exposure apparatus including an illuminating optical system for irradiating the light emitted from a light source on a first object (reticle) and a projection optical system for projecting the image of the first object onto a second object (wafer), and the projection exposure apparatus on the whole is enclosed in a first chamber which in turn includes a second chamber enclosing a space containing the optical path of the exposure light between the projection optical system and the second object (wafer) that is an object to be exposed and means for separately adjusting the temperature of the air in the first and second chambers, respectively, thereby accomplishing the previously mentioned object.

Further, it is preferable from the image distortion and fluctuation preventing point of view to provide a third chamber enclosing a space containing the optical path of the exposure light between the first object (reticle) formed with a given pattern to be projected onto the second object (wafer) and the projection optical system and to separately adjust the temperature of the air in the first, second and third chambers, respectively.

A major cause of such distortion and fluctuation of the projected image is variation in the refractive index of the air in the spaces forming the optical paths of the exposure light. Each of the first and second chambers encloseing such space includes no heat source therein and the capacity of the chamber is small, thus reducing the heat load in the chamber and thereby making it possible to control the air temperature with a very high degree of accuracy.

While these second and third chambers should preferably be provided so as to minimize their capacities, if it is arranged so that the second chamber encloses the wafer stage surrounding space containing the optical paths of the interferometer-type linear scale for detecting the positions of the wafer stages so far as the capacity of the second chamber is not increased so much, there is the effect of decreasing the wafer position detecting error and this is advantageous from the standpoint of enhancing the alignment accuracy.

It is to be noted that the third chamber is not always required in cases where the reduction projection is performed by the projection optical system. The reason is that if the reduction ratio of the reduction projection optical system is m times, the effect of the variation in the refractive index of the air between the reticle and the projection optical system is inceased by 1/m times and thus the effect of the variation in the refractive index of the air between the reticle and the projection optical system is small as compared with the spaces between the projection optical system and the wafer.

DISCRIPTION OF THE PREFERRED EMBODIMENTS

Figure 1:
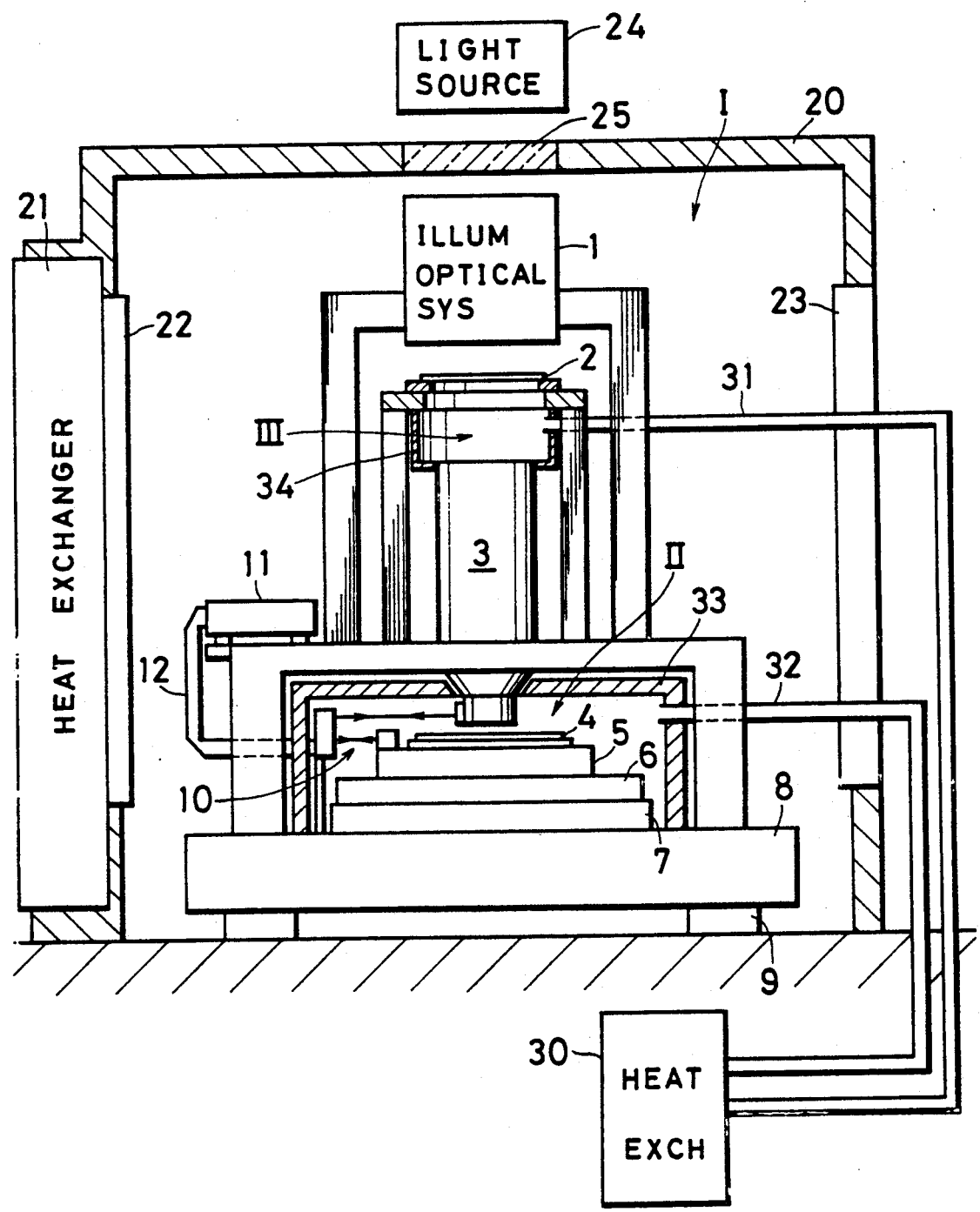
FIG. 1 is a schematic diagram showing the construction of a projection exposure apparatus according to an embodiment of the present invention.

FIG. 1 is a schematic diagram showing the construction of a projection exposure apparatus according to the present invention. In the Figure, a reticle 2 is illuminated by an illuminating optical system 1 so that the pattern formed on the reticle 2 is projected and transcribed through a projection lens 3 on an exposure area of a wafer 4 which is positioned just below the projection lens 3.

The wafer 4 is movable in a vertical direction (the direction of the optical axis of the projection lens) by a Z-stage 5 and it is also movable in X and Y directions (the directions perpendicular to the optical axis of the projection lens) by an X-stage 6 and a Y-stage 7, respectively. Then, the X-direction and Y-direction positions of the wafer 4 are monitored by a laser interferometer-type linear scale 10 so that the wafer 4 is positioned in a desired position by the X-stage 6 and the Y stage 7. Also, the height of the surface of the wafer 4 is detected by a height sensor which is not shown and its height position is adjusted by the Z-stage 5.

The above-described apparatus on the whole is mounted on a surface table 8 subjected to vibration damping by a plurality of vibration damping bases 9 and the apparatus on the whole is arranged in a first chamber I enclosed by a housing 20. The first chamber itself is of the same construction as the one included in the conventional exposure apparatus so that the air adjusted to a given temperature by a heat exchanger 21 is blown into the first chamber through a blowing duct 22 and the blown air is discharged through a return duct 23. It is to be noted that light source 24 (e.g., a lamp) for supplying the illuminating light to the illuminating optical system 1 is arranged outside the first chamber and the illuminating light is transmitted into the chamber through a light transmission window 25.

The space forming the optical path of the exposure light between the projection lens 3 and the wafer 4 inside the first chamber I is enclosed by an internal housing 33. This space forms a second chamber II. In this embodiment, the second chamber II contains the space around the wafer stages (the Z-stage 5, the X-stage 6 and the Y-stage 7) which includes the optical paths of the interferometer-type linear scale 10. In this case, a laser light source 11 of the linear scale 10, which forms a heat source, is arranged outside the second chamber II and the laser beam is introduced into the second chamber II through an induction optical system covered with a pipe 12.

Also, in the present embodiment a third chamber III is formed by another internal housing 34 which encloses the space containing the optical path of the exposure light between the reticle 2 and the projection lens 3.

Then, the air adjusted to a given temperature and delivered by a heat exchanger 30 is supplied into the second and third chambers II and III through blowing pipes 31 and 32. It is to be noted that a gap is formed between the projection lens 3 and each of the housings 33 and 34 of the second and third chambers II and III so as to prevent the vibrations due to the blowing from being transmitted to the projection lens 3, it is also desirable that the pipes 31 and 32 are made from a material capable of absorbing the vibrations of the heat exchanger 30.

The air blown into the second and third chambers II and III is allowed to flow out from the holes (not shown) fromed through the respective housings and it is possible to prevent the air from flowing backward by adjusting the amount of air blown in such a manner that the internal pressures of the chambers II and III are slightly higher than the external pressure. Of course, return ducts may be provided so as to return the air to the heat exchanger 30. Also, thought not shown in the Figure, the housing 33 is provided with a door to permit the wafer 4 to be moved in and out and the door is constructed so as to be opened and closed only when a wafer is moved in and out.

It is to be noted that where the projection lens 3 is a reduction projection lens, as mentioned previously, the detrimental effect due to variation in the refractive index of the air between the reticle 2 and the projection lens 3 is reduced and therefore the internal chamber III need not always be provided.

Figure 2:
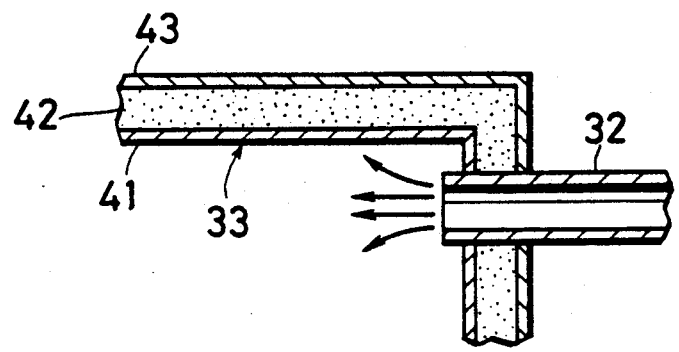
FIGS. 2 and 3 are sectional views showing respectively the constructions of the partition walls of chambers according to the present invention.

As shown in FIG. 2, the partition wall of the internal housing 33 has a structure such that a heat insulating material 42 is filled between an inner metal plate 41 and an outer plate member 43. By so doing, it is possible to reduce the effect of the heat generated externally of the chamber on the interior of the chamber, and also the selection of a highly heat conductive material for the metal plate 42 has the effect of causing the whole inner surface of the housing partition wall to rapidly attain substantially the same temperature as the air blown through the pipe 32, thereby accurately controlling the temperature of the air in the chamber.

Figure 3:
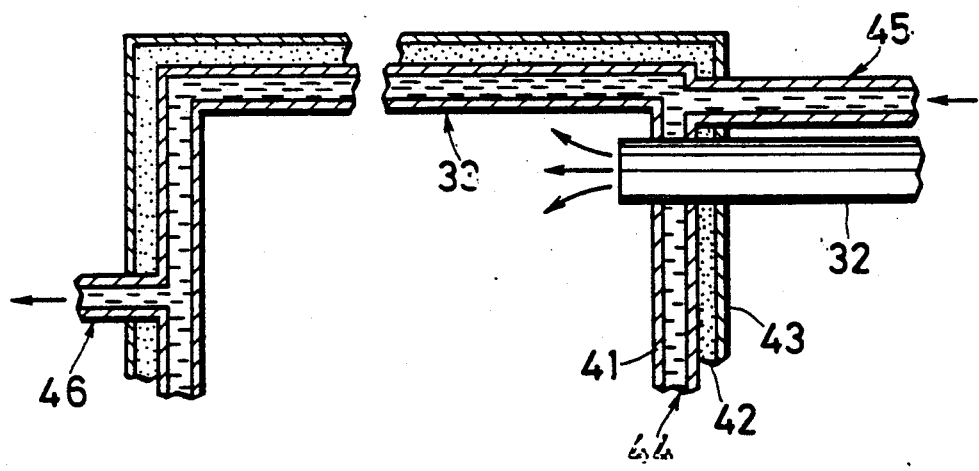
Figure 4:
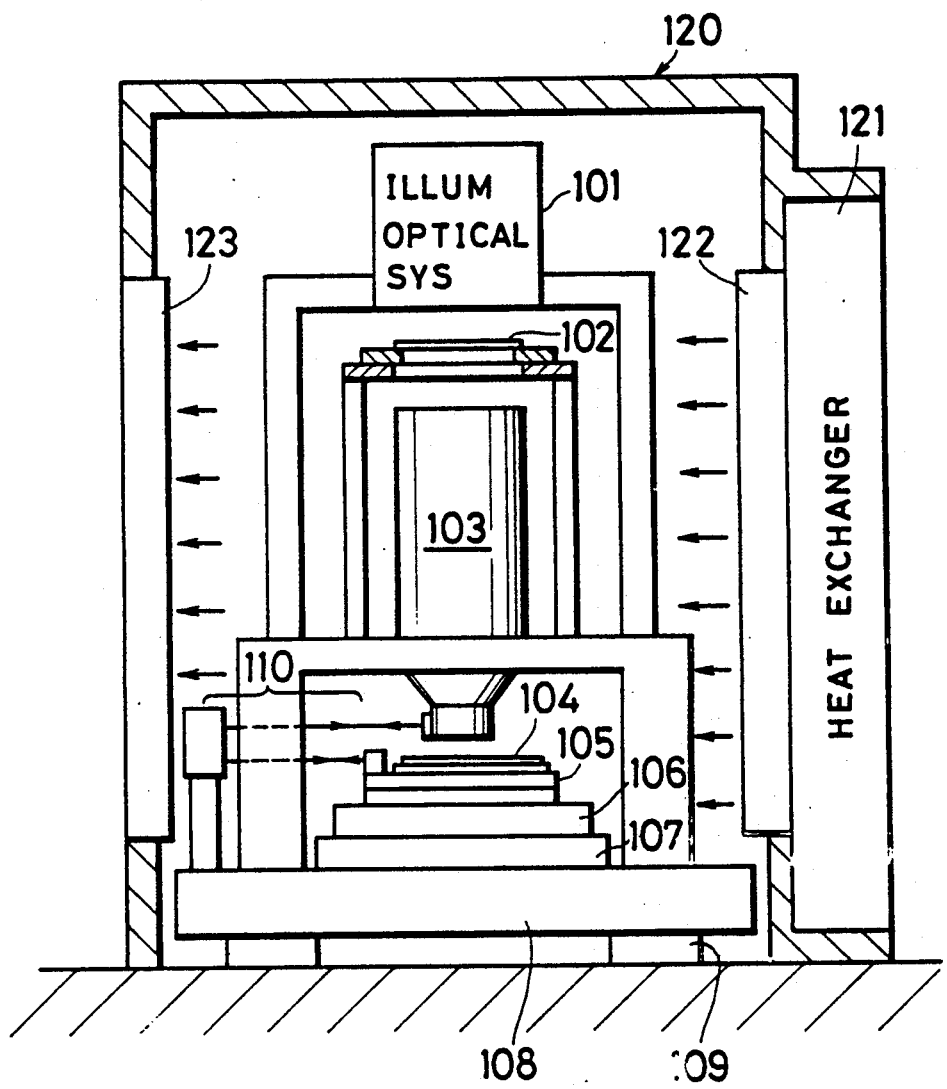
FIG. 4/is a schematic diagram showing the construction of a conventional apparatus.

FIG. 3 is a sectional view showing a modification of the partition wall of the internal housing 33. While the modification of FIG. 3 is the same with FIG. 2 in that the inner side of the partition wall of the internal husing 33 is composed of the metal plate 41 and the outer side is composed of the plate member 43, the interior of the partition wall has a two-layer structure in the modification. In the Figure, the inner layer of the partition wall is formed with a fluid path 44 for supplying a temperature controlled fluid so that fluid is introduced through a fluid inlet 45 and it is discharged through a fluid outlet 46. Also, the heat insulating material 42 is filled on the outer side of the fluid path 44 between it and the plate member 43.

By using the above-mentioned partition wall structure so as to effect a temperature control such taht the temperature of the fluid coincides with the temperature of the air blown through the pipe 32, the inner temperature of the chamber can be more uniformly and accurately maintained at a given temperature and the variation in the refractive index distribution of the air inside the chamber can be reduced considerably.

What is claimed is:

1. A projection exposure apparatus comprising:
   an illuminating optical system for irradiating a first object with light emitted from a light source;
   a projection optical system for projecting an image of said first object onto a second object;
   an external housing forming a first chamber for enclosing said illuminating optical system and said projection optical system;
   an internal housing forming a second chamber arranged inside said first chamber to enclose a space containing an optical path formed between said projection optical system and said second object; and
   temperature adjusting means for separately adjusting an internal air temperature in each of said first and second chambers.

2. An apparatus according to claim 1, wherein said temperature adjusting means comprises a first heat exchanger for adjusting an internal air temperature of said first chamber, and a second heat exchanger for adjusting an internal air temperature of said second chamber.

3. A projection exposure apparatus comprising:
   an illuminating optical system for irradiating a first object with light emitted from a light source;
   a projection optical system for projecting an image of said first object onto a second object;
   an external husing forming a first chamber for enclosing said illuminating optical system and said projection optical system;
   a first internal housing forming a second chamber arranged inside said first chamber to enclose a space containing an optical path formed between said projection optical system and said second object;
   a second internal housing forming a third chamber arranged inside said first chamber to enclose a space containing an optical path formed beteen said first object and said projection optical system; and
   temperature adjusting means for separately adusting an internal air temperature of said first chamber and internal air temperatures of said second and third chambers.

4. An apparatus according to claim 3, wherein said temperature adjusting means comprises a first heat exchanger for adjusting an internal air temperature of said first chamber, and a second heat exchnger provided independently of said first heat exchanger to adjust an internal air temperature of each of said second and thir chambers.

* * * * *